(12) United States Patent
Bao et al.

(10) Patent No.: US 7,952,445 B2
(45) Date of Patent: May 31, 2011

(54) METHOD AND ARRANGEMENT FOR A VOLTAGE CONTROLLED OSCILLATOR CIRCUIT

(75) Inventors: Mingquan Bao, Västra Frölunda (SE); Harald Jacobsson, Västra Frölunda (SE); Yinggang Li, Askim (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 93 days.

(21) Appl. No.: 12/447,804

(22) PCT Filed: Oct. 30, 2006

(86) PCT No.: PCT/SE2006/050441
§ 371 (c)(1),
(2), (4) Date: Apr. 29, 2009

(87) PCT Pub. No.: WO2008/054273
PCT Pub. Date: May 8, 2008

(65) Prior Publication Data
US 2010/0073100 A1    Mar. 25, 2010

(51) Int. Cl.
*H03B 5/12* (2006.01)

(52) U.S. Cl. .................................. 331/117 R; 331/167
(58) Field of Classification Search ............... 331/117 R, 331/167, 169
See application file for complete search history.

(56) References Cited

U.S. PATENT DOCUMENTS
2005/0156682 A1* 7/2005 Lee et al. ................ 331/177 V

FOREIGN PATENT DOCUMENTS
EP         0863605 A2     9/1998

OTHER PUBLICATIONS
Rogers, J.: "The Effect of Varactor Non-Linearity on the Phase Noise of a Completely Integrated 1.8 GHz VCO" Bipolar/BICMOS Circuits and Technology Meeting, 1999, pp. 141-144, Minneapolis, MN.

* cited by examiner

*Primary Examiner* — Joseph Chang

(57) ABSTRACT

In a voltage controlled oscillator circuit comprising two transistors, the first terminals of each said two transistors, are coupled together and to a supply voltage, two interconnected resonator units, and each of said two resonator units couples a respective second terminal of said two transistors to third terminals of both said transistors.

12 Claims, 5 Drawing Sheets

METHOD AND ARRANGEMENT FOR A VOLTAGE CONTROLLED OSCILLATOR CIRCUIT

TECHNICAL FIELD

The present invention relates to voltage controlled oscillators in general, specifically to methods and arrangements enabling an improved balanced voltage controlled oscillator.

BACKGROUND

The development of wireless communication systems has increased the demand for monolithically integrated, low-cost and low-phase-noise voltage controlled oscillators (VCO:s).

However, due to several factors, it becomes increasingly more difficult to design low phase noise VCO:s as the demand for even higher frequencies (i.e. >20 GHz) increases. One factor is that the so-called Q-factor of resonators decreases with increasing frequency, due to the increase of losses of on-chip varactor diodes and inductors. Another problematic factor is that the switching performance of the active devices (i.e. transistors) in the oscillator circuit deteriorates with increasing frequency. This adds undesirable phase delays and also increases the period during which the transistor generates most noise in the VCO. In addition, in order to increase the $f_t$ or $f_{max}$ of the transistor, the breakdown voltage decreases, this limits the signal swing of the oscillator, thus limiting the phase noise performance.

There is therefore a need for monolithically integrated, low-cost VCO:s with improved phase-noise performance under the above-mentioned circumstances.

SUMMARY

A general object is to enable an improved voltage controlled oscillator.

A specific object is to enable a voltage controlled oscillator with low phase noise for high frequencies.

According to an embodiment of the present invention an improved voltage controlled oscillator comprises two transistor units Q1, Q2, each with three terminals Q11, Q12, Q13; Q21, Q22, Q23, and wherein the respective first terminals Q11, Q21 are coupled together and to a supply voltage $V_b$, and at least two resonator units R1, R2. Each of the resonator units R1, R2 are arranged between a respective second terminal Q12, Q22 of one transistor Q1, Q2 and the third terminal Q13, Q23 of both transistors Q1, Q2.

Advantages of a voltage controlled oscillator circuit according to the present invention comprise enabling an improved voltage controlled oscillator with reduced phase noise and a reduced maximum collector-emitter voltage of transistors. Further, the voltage controlled oscillator provides an improved phased noise performance at high frequencies (>20 GHz).

BRIEF DESCRIPTION OF THE DRAWINGS

The invention, together with further objects and advantages thereof, may best be understood by referring to the following description taken together with the accompanying drawings, in which.

ABBREVIATIONS

VCO Voltage Controlled Oscillator
CMOS Complementary Metal Oxide Semiconductor transistor
MOSFET Metal-Oxide Semiconductor Field-Effect Transistor
IC Integrated Circuit

DETAILED DESCRIPTION

The present invention will be described in the context of bipolar transistors; however, it is equally applicable to other transistors, i.e. MOSFET or CMOS, with appropriate modifications.

Figure 1:
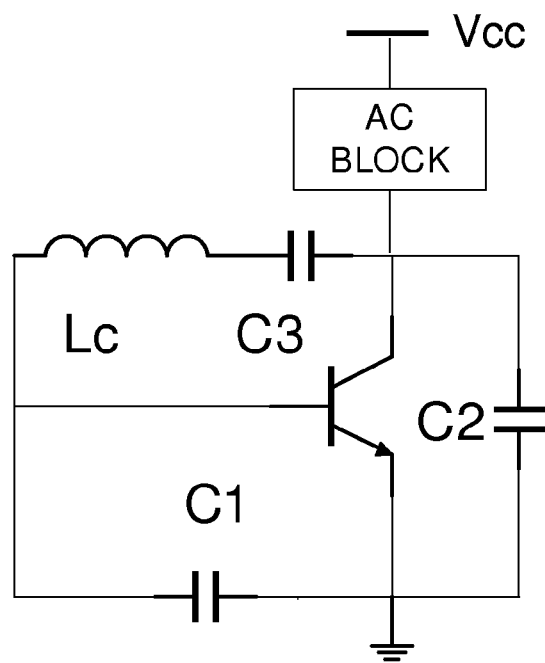
FIG. 1 is a schematic illustration of prior art.

Since it is very difficult to improve the Q-factor of the resonator, especially the Q-factor of varactors, great effort has been put into the development of Voltage Controlled Oscillator (VCO) circuit topology. For example a known topology is Clapp VCO [1], [2], as illustrated by FIG. 1, which because of the existence of the capacitor C3 allows the voltage swing across the inductor to exceed considerably the collector-base voltage of the transistors, and therefore to exceed the supply and even device breakdown voltages. The large voltage swing increases signal to noise ratio and so improves the VCO performance.

Figure 2:
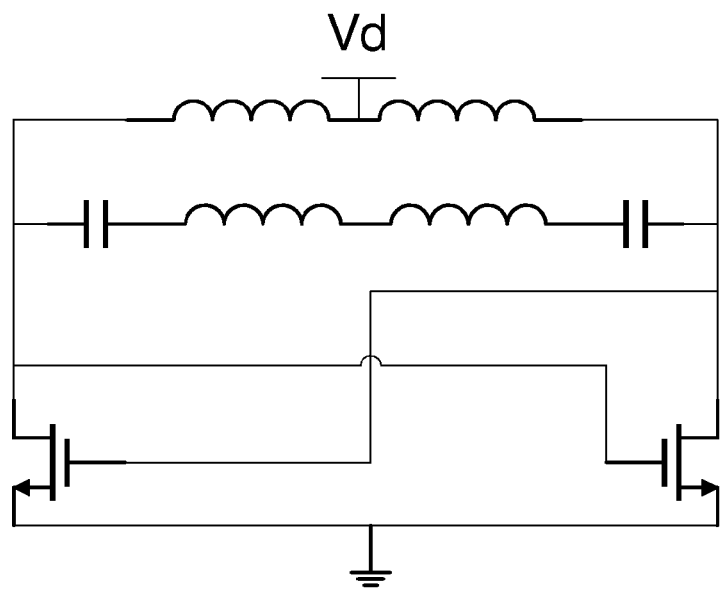
FIG. 2 is a schematic illustration of prior art.

However, the unbalanced design of FIG. 1 makes it difficult to decouple the supply voltage and ground at high frequencies and therefore the VCO has no immunity to common mode noise. A known balanced VCO based on cross-coupled topology using Clapp-type resonators can overcome this problem [3]. The DC supply is connected to the virtual grounds. The schematic of the balanced VCO is shown in FIG. 2, where the so-called cross-coupled configuration is used to supply negative resistance. This structure works fine for moderate frequencies but its phase-noise performance deteriorates quickly at higher frequencies (above say 20 GHz).

Figure 3:
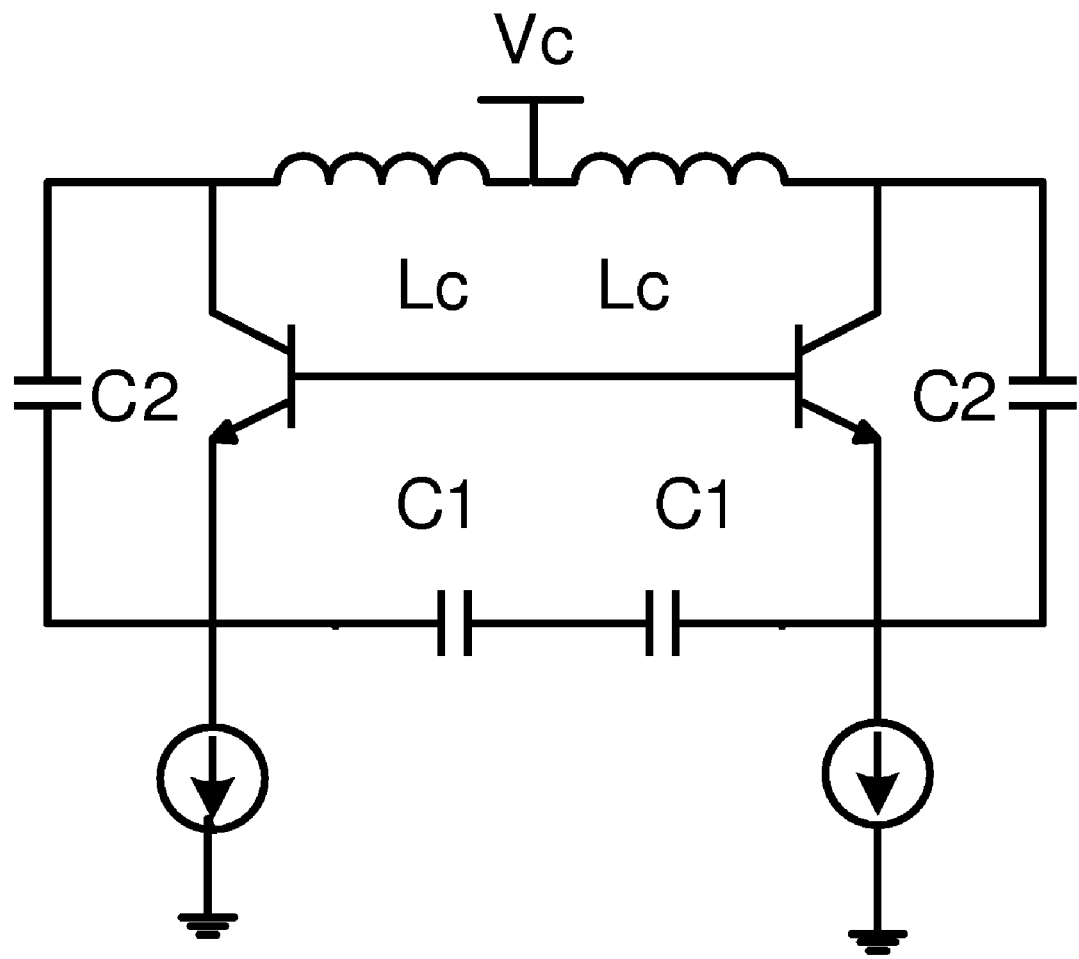
FIG. 3 is a schematic illustration of prior art.

In comparison with the above mentioned cross-coupled configuration, the balanced Colpitts VCO as shown in FIG. 3, has superior cyclo-stationary noise properties and can achieve low phase noise at high frequencies [4], [5]. However, an inherently limited voltage swing prevents it from achieving further low noise performance.

In order to overcome the above-described disadvantages and problems with known VCO designs, the present invention discloses a novel balanced VCO.

According to a basic embodiment, the present invention discloses a VCO topology that makes use of the advantages of both the Clapp and the balanced Colpitt's topology to improve the phase noise performance of the VCO. Moreover, by adding a negative feedback path for common-mode signals, the transistors 1/f noise up-conversion is reduced significantly according to the invention.

The present invention will be described in the context of but not limited to a balanced VCO circuit including two bipolar transistors. It is equally plausible to employ the embodiments of the present invention to any semiconductor technology comprising any of e.g. CMOS, bipolar, Silicon, GaAs etc. The VCO of the present invention can be fully integrated on a chip but can also optionally be made with discrete components or a mixture of integrated circuits (IC:s) and discrete components.

According to a basic embodiment, the VCO basically comprises two transistor units Q1, Q2 and two resonator units or tanks R1, R2. First terminals of the transistors are connected to each other. Each resonator unit or tank is connected between a second terminal of a respective transistor unit and third terminals of both transistors.

Figure 4:
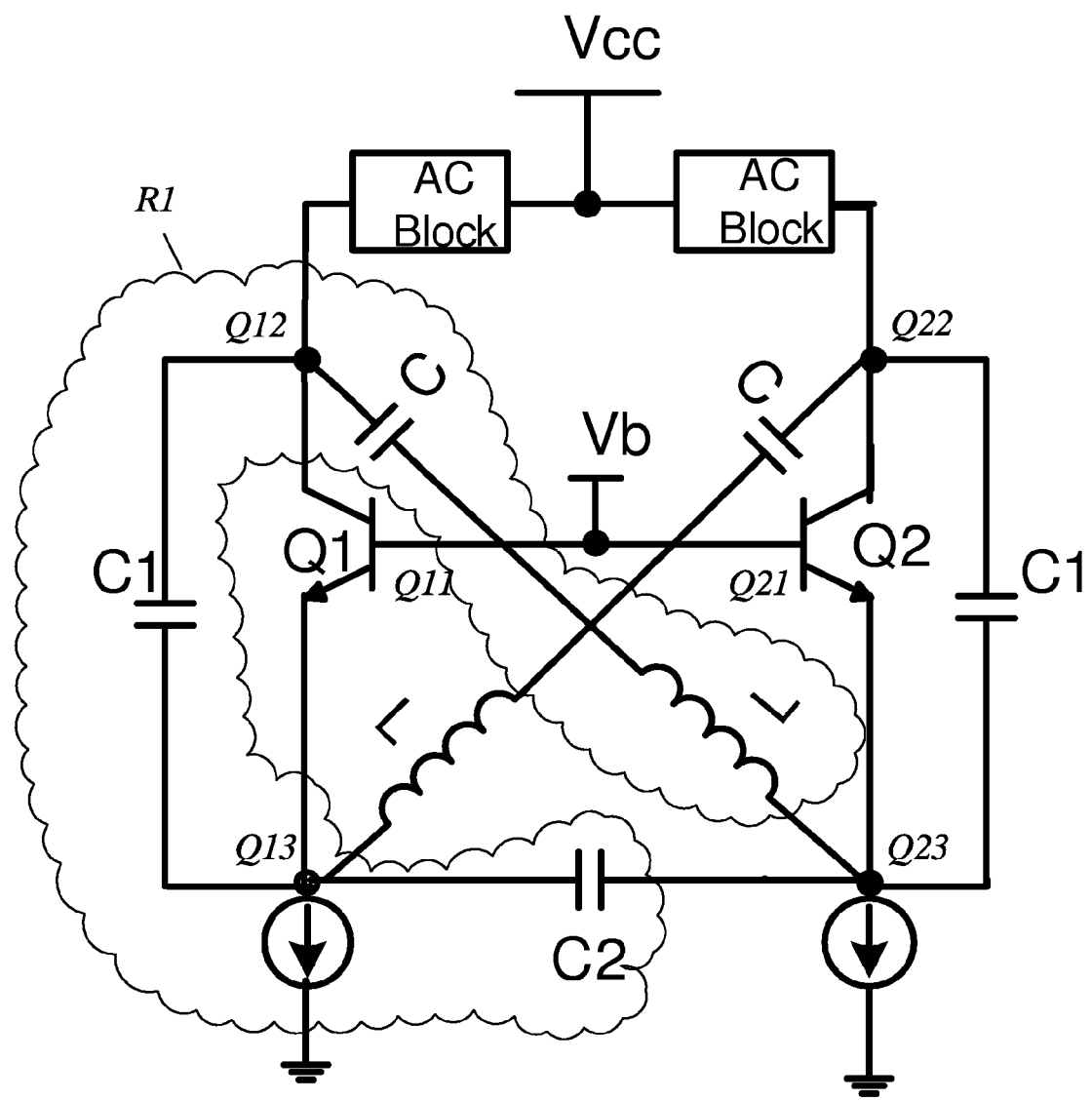
FIG. 4 is a schematic illustration of an embodiment of the present invention.

With reference to FIG. 4, a basic embodiment of the present invention comprises two transistors Q1, Q2, each with three terminals Q11, Q12, Q13; Q21, Q22, Q23. The first terminal Q11, Q21 of each transistor Q1, Q2 are coupled to each other and to a supply voltage source $V_b$. The second terminal Q12 of the first transistor Q1 is connected to the third terminals Q13, Q23 of both transistors, via a first resonator unit or tank R1. The second terminal Q22 of the second transistor is connected to the third terminals Q13, Q23 of both transistors via a second resonator unit or tank R2. Each resonator unit R1, R2, according to a specific embodiment, includes an inductor L, a first capacitor C, a second capacitor C1 and at least one third shared capacitor C2. In the embodiment of FIG. 4, the two resonators are connected via the third capacitor C2, but according to another embodiment the resonators can be connected via two or more capacitors C2. One of the resonator units R1 is indicated by an enclosing cloud in the FIG. 4. For clarity reasons the second resonator unit R2 is not indicated in the same manner. However, it is evident that a corresponding enclosing cloud could be drawn around the second resonator unit R2.

Figure 5:
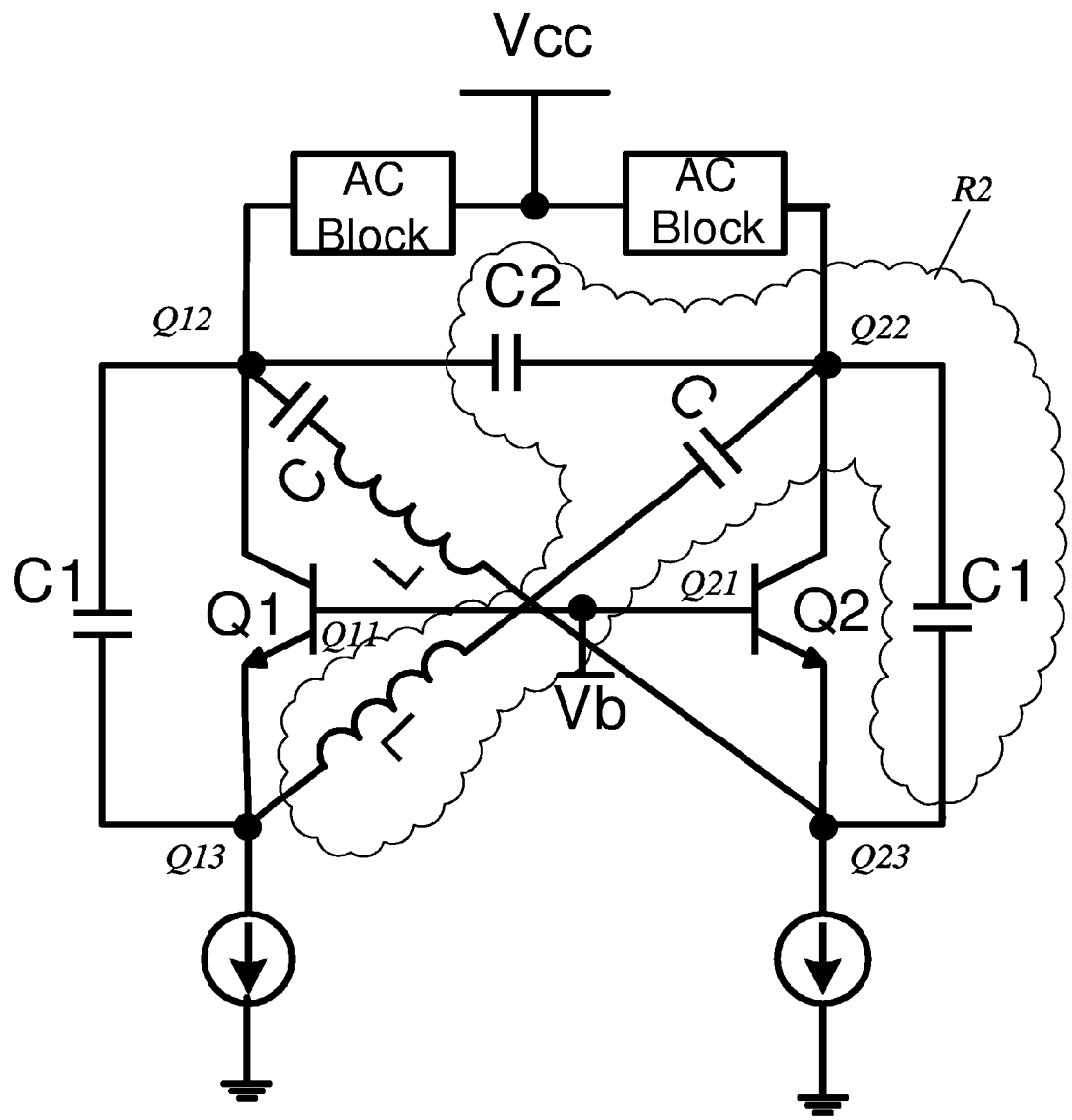
FIG. 5 is a schematic illustration of another embodiment of the present invention.

The at least one third capacitor(s) C2 can according to one embodiment be connected between the third terminals Q13, Q23 of the two transistors Q1, Q2. However, with reference to FIG. 5, the third capacitor(s) C2 can according to another embodiment be connected between the second terminals Q12, Q22 of the two transistors. In a corresponding manner to FIG. 4, only one of the resonator units is indicated by an enclosing cloud, in this case the second resonator R2. However, it is easy to envision how to draw a corresponding cloud for the first resonator R1.

In addition, the VCO according to the present invention comprises AC blocks and a supply voltage $V_{cc}$, and the third terminals Q13, Q23 of both transistors are grounded or connected to a respective dc current supply.

Each of the resonator units R1, R2 or tanks according to the invention consists of an inductor, and three capacitors according to the above, thereby constituting two Clapp-type resonator units. The individual resonator units are coupled by sharing at least one capacitor The above-described embodiments enable a balanced VCO circuit topology without using the known cross-coupled configuration to generate negative resistance (such as in FIG. 2). Further, the embodiments enable a VCO where the resonator unit(s) are located between the second terminal Q12, Q22 i.e. collector of one transistor and the two third terminals Q13, Q23 i.e. emitters of the two transistors. Finally, the second terminal Q12, Q22 i.e. collector of one transistor is connected with the third terminal i.e. emitter for the other transistor via series connected inductor L and capacitor C, which forms a negative feedback path for common-mode signals. This acts to suppress the second harmonic component, which is a common mode signal. The second harmonic components may degrade the oscillator waveform symmetry, leading to the significant 1/f noise up-conversion [6].

According to the embodiments of the present invention, AC currents which flow through the series connected inductor L and capacitor C can reduce the maximum collector-emitter voltage of the transistor in the case of the transistor is in off-state, compared to a VCO without these LC paths. Thus, the invented topology is suitable for a high frequency VCO where the transistors have low collector-emitter breakdown voltage.

Figure 6:
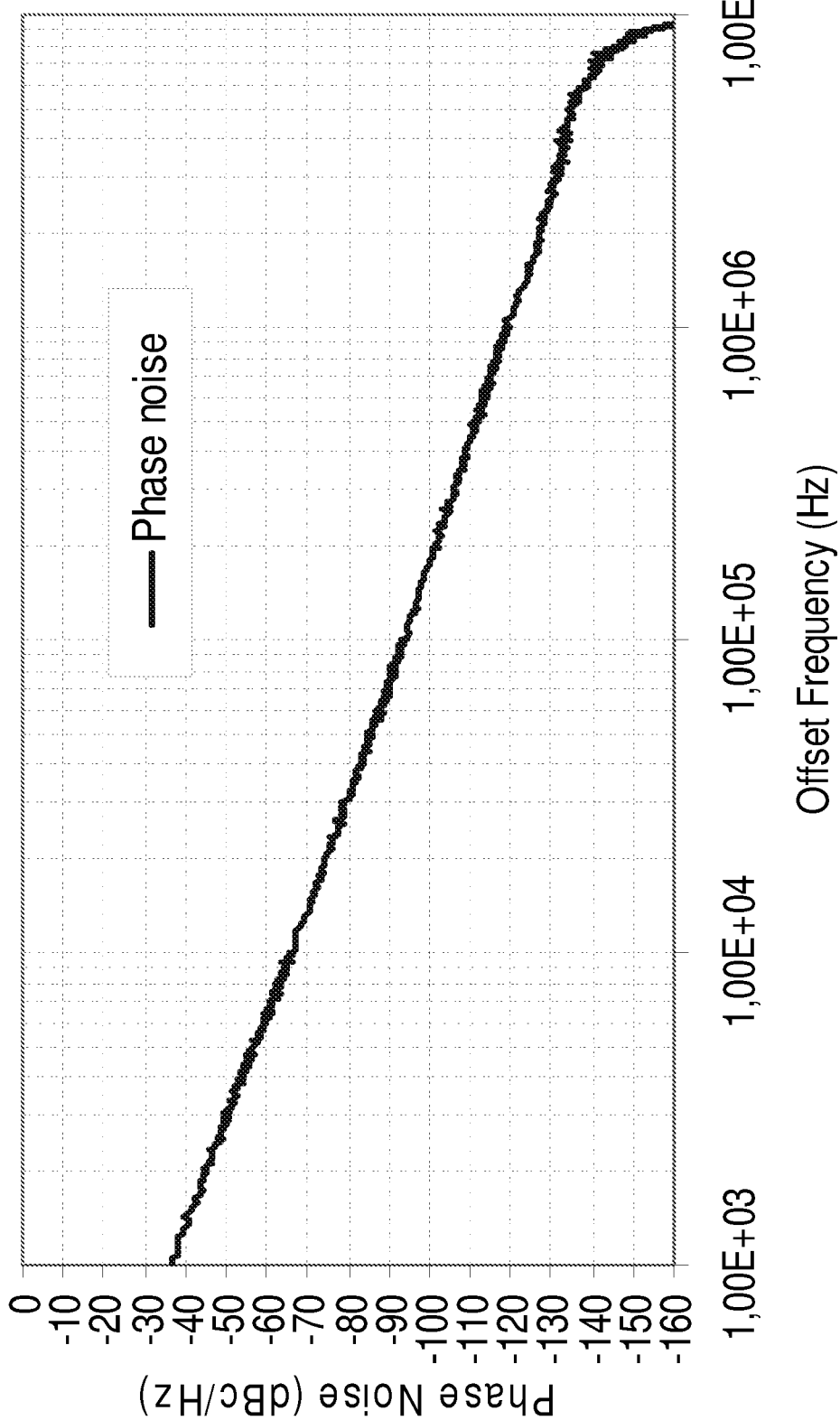
FIG. 6 is a graph illustrating the measured phase noise vs. offset frequency for an implementation of the embodiment of FIG. 4.

An embodiment of a VCO according to the present invention, as represented by FIG. 4, has been implemented in SiGe technology. The VCO oscillates at a centre frequency of 20 GHz. It can be found from FIG. 6 that this VCO has a very low phase noise. Comparing with a conventional Colpitts VCO (as illustrated in FIG. 3), which was also implemented in the same SiGe technology, the present invention is 7 dB lower in phase noise. Thereby, the present invention provides a clear advantage and improvement over known VCO designs.

In summary, the advantages of the VCO of the present invention in comparison with the known VCO:s include:

A balanced VCO with several advantages over the unbalanced Clapp VCO of [1], [2], e.g. there are two differential outputs; it is easy for high-frequency grounding as well as decoupling of supply voltages due to the virtual ground nodes.

Compared to the balanced VCO of [3] (based on Clapp-type resonator) the present invention gives better phase noise performance at high frequency (>20 GHz). The known VCO works well when transistor delays (phase shifts) are small relative to the operating frequency, but its performance deteriorates quickly when the delay is a substantial part of a signal period. By properly tuning the capacitors and inductors in the VCO of the present invention a good phase noise can be achieved at high frequencies.

Compared to the balanced VCO of [3] (base on Clapp-type resonator) the resonator in present invention is not located between second terminals e.g. collectors of the transistors, instead it is between the second terminal e.g. collector of one transistor and the two third terminals e.g. emitters of the two transistors.

Compared to the known high frequency Colpitts VCO of [4], [5], the VCO of the present invention gives better phase noise performance by utilizing a Q-enhanced resonator i.e. Clapp resonator.

Compared to the known high frequency Colpitts VCO of [4], [5] the VCO of the present invention reduces the phase noise due to less 1/f noise up-conversion.

Compared to the known high frequency Colpitts VCO of [4], [5] the VCO of the present invention reduces the maximum transistor collector-emitter voltage.

It will be understood by those skilled in the art that various modifications and changes may be made to the present invention without departure from the scope thereof, which is defined by the appended claims.

REFERENCES

[1] J. K. Clapp, "*An inductance-capacitance oscillator of unusual frequency stability*", Proc. IRE, vol. 367, pp. 356-358, March 1948.

[2] A. Megej, K. Beilenhoff, and H. L. Hartnagel, "*Fully monolithically integrated feedback voltage controlled oscillator*", IEEE Microwave and Guided Wave Letters, Vol. 10, No. 6, pp. 239-241, June, 2000

[3] J. Craninckx and M. S. J. Steyaert, "*A 1.8-GHz CMOS low-phase-noise voltage-controlled oscillator with prescaler*", IEEE J. Solid-State Circ., Vol. 30, No. 12, pp. 1474-1482, December 1995.

[4] R. Aparicio, A. Hajimiri, "*A noise-shifting differential Colpitts VCO*", IEEE. J. Solid-State Circ., Vol. 37, No. 12, pp. 1728-1736, December 2002.

[5] M. Bao, Y. Li, and H. Jacobsson, "*A 21.5/43 GHz dual-frequency balanced Colpitts VCO in SiGe*", IEEE J. Solid-State Circ., Vol. 39, No. 8, pp. 1352-1355, August 2004.

[6] J. Choi and A. Mortazawi, "*Design of push-push and triple push oscillators for reducing 1/f noise upconversion*", IEEE Trans. Microwave Theory and Techniques, vol 53. No. 11, pp 3407-3414, 2005.

What is claimed is:

1. A voltage controlled oscillator (VCO) circuit comprising:
   a first transistor;
   a second transistor, wherein
      the first transistor and the second transistor each comprising a first, second, and third terminal;
   a supply voltage, wherein
      the first terminal of the first transistor and the first terminal of the second transistor are coupled to each other, and
      the supply voltage;
   a first resonator unit; and
   a second resonator unit, wherein
      the first resonator unit couples the second terminal of the first transistor to the third terminal of the second transistor, and
      the second resonator unit couples the second terminal of the second transistor to the third terminal of the first transistor.

2. The voltage controlled oscillator according to claim 1, wherein said first resonator unit and said second resonator unit share and are coupled via at least one common capacitor.

3. The voltage controlled oscillator according to claim 2, wherein the at least one common capacitor couples said second terminal of the first transistor and said second terminal of the second transistor.

4. The voltage controlled oscillator according to claim 3, wherein said series coupled inductor and capacitor provides negative feedback paths for common-mode signals.

5. The voltage controlled oscillator according to claim 1, wherein said at least one common capacitor couples said third terminal of the first transistor and the third terminal of the second transistor.

6. The voltage controlled oscillator according to claim 1, further comprising a respective AC unit coupling
   the second terminal of the first transistor to a common supply voltage to provide DC paths and to provide an impedance to AC signals; and
   the second terminal of the first transistor to the common supply voltage to provide DC paths and to provide said impedance to AC signals.

7. The voltage controlled oscillator according to claim 1, wherein said transistors are bipolar transistors, and wherein each of said first terminal is a base terminal, each of said second terminal is a collector terminal and each of said third terminal is an emitter terminal.

8. The voltage controlled oscillator according to claim 1, wherein
   the third terminal of the first transistor is coupled to a DC current supply and is isolated from ground; and
   the third terminal of the second transistor is coupled to the DC current supply and is isolated from ground.

9. The voltage controlled oscillator according to claim 1, wherein the first resonator unit and the second resonator unit comprise a Clapp-type resonator.

10. The voltage controlled oscillator according to claim 1, wherein said voltage controlled oscillator is balanced.

11. The voltage controlled oscillator according to claim 1, wherein the first and the second transistors are selected from the group consisting of a bipolar and CMOS.

12. The voltage controlled oscillator according to claim 1, wherein the first resonator comprises
   a first inductor and a first capacitor coupled in series between the second terminal of the first transistor and the third terminal of the second transistor, and
   a second capacitor coupled in series between the second terminal of the first transistor and the third terminal of the first transistor; and
   the second resonator comprises a second inductor and a third capacitor coupled in series between the second terminal of the second transistor and the third terminal of the first transistor, and
   a fourth capacitor coupled in series between the second terminal of the second transistor and the third terminal of the second transistor.

* * * * *